(12) United States Patent
Wilson et al.

(10) Patent No.: US 7,553,048 B2
(45) Date of Patent: Jun. 30, 2009

(54) STABILIZED MIRROR SYSTEM FOR A HANDHELD LASER POINTER

(76) Inventors: Jeffrey Dale Wilson, 5447 Palace Ct., Goleta, CA (US) 93111; Daniel Steven Sanchez, P.O. Box 14, Summerland, CA (US) 93067

( * ) Notice: Subject to any disclaimer, the term of this patent is extended or adjusted under 35 U.S.C. 154(b) by 259 days.

(21) Appl. No.: 11/824,312

(22) Filed: Jun. 29, 2007

(65) Prior Publication Data

US 2009/0002828 A1    Jan. 1, 2009

(51) Int. Cl.
*F21V 7/00*    (2006.01)
(52) U.S. Cl. ........................ 362/297; 362/298; 362/259; 362/301; 362/322; 362/342; 372/107; 372/14; 372/16; 372/92; 372/101

(58) Field of Classification Search ................. 362/297, 362/298, 259, 301, 322, 342; 372/14, 16, 372/92, 101, 107
See application file for complete search history.

(56) References Cited

U.S. PATENT DOCUMENTS 7,380,722 B2 *   6/2008   Harley et al. ........... 235/462.45

* cited by examiner

*Primary Examiner*—Sandra L O'Shea
*Assistant Examiner*—Mark Tsidulko
(74) *Attorney, Agent, or Firm*—Michael G. Petit

(57) ABSTRACT

A hand-held laser pointer is disclosed wherein the laser beam is isolated from unwanted hand tremor motions of the laser pointer housing. A laser beam is directed toward a pair of passively inertially stabilized mirrors disposed within the housing that are biased to a neutral position by a spring and damper. Both the laser beam that exits the housing and the laser dot appearing at a target are minimally affected by laser jitter associated with hand tremor.

2 Claims, 3 Drawing Sheets

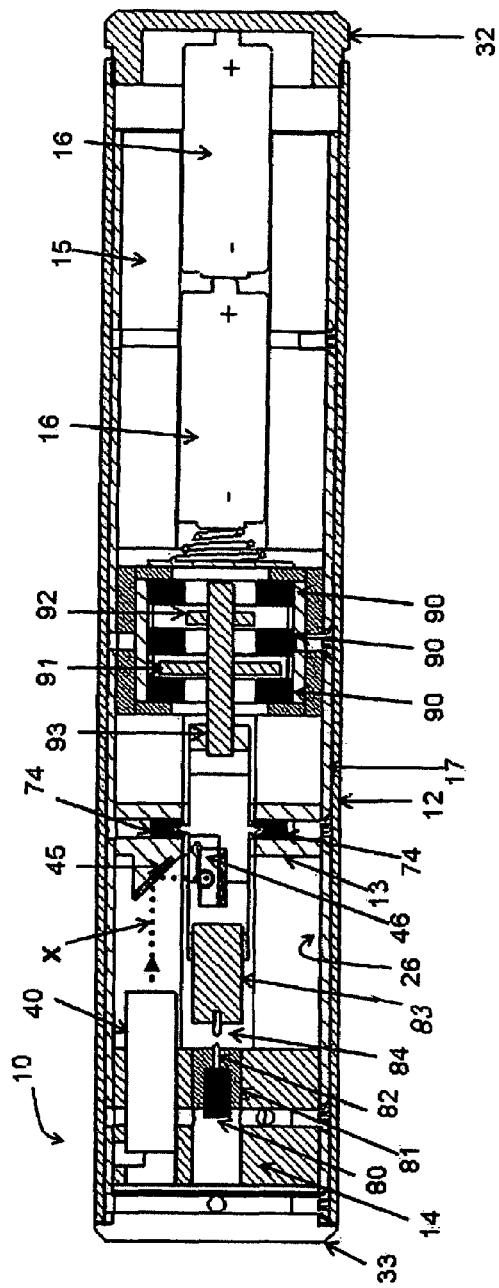
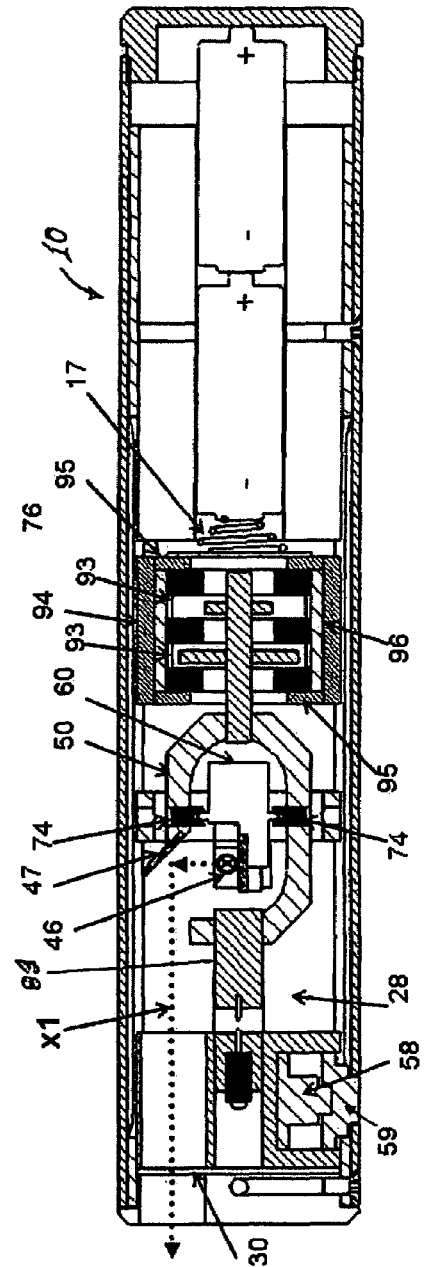
Figure 2
Figure 3

STABILIZED MIRROR SYSTEM FOR A HANDHELD LASER POINTER

BACKGROUND OF THE INVENTION

1. Field of the Invention

The present invention relates to laser pointers. More particularly, the present invention relates to hand-held laser pointers. Even more particularly, the present invention relates to a hand-held laser pointer stabilized against hand tremor.

2. Prior Art

Various hand-held laser pointers have been taught for visually pointing out a target on, for example, a whiteboard, chart, map, or projected display. Laser pointers typically include a laser diode module that produces a collimated laser beam. The laser diode module is packaged within a housing and is battery powered. In operation, a user holds the pointer in one hand and directs the laser beam towards a target, generally during a presentation or the like.

The effectiveness of such hand-held laser pointers for particularly pointing out a target is reduced by the unintentional tremor of the user's hand. Human tremor is an involuntary trembling or shaking of the muscles of the body associated with physical weakness, emotional stress, or excitement. The small angular movements of the hand from tremor impart undesirable motion to the laser pointer and its corresponding laser beam and image, which is generally a small dot indicating where the beam is striking the target. This unwanted motion is amplified as the distance between the laser diode and the target increases and generally results in visibly shaky movements of the laser dot. The jitter of the laser dot limits the user's pointing resolution which may distract an audience, expose nervousness and may serve to discredit the user.

To address this problem, Wilson and Sanchez, in U.S. Patent Application Publication number 20050128749, disclose a laser module isolated from unwanted hand tremor motions of the laser pointer housing while still operable for pointing the laser beam in an arbitrary direction. In the embodiment disclosed in the aforesaid application, the laser itself is used as part of the inertial mass that is stabilized from unwanted hand tremor motion.

Applications other than laser pointers such as, for example, optical recording and laser ranging also require a jitter-free dot. While recent improvements in jitter-stabilized lasers have attempted to address the dot-jitter problem, there remains a need for a compact, hand-held laser pointer wherein the stability of the laser dot position on a target is unaffected by hand tremor.

SUMMARY

In a preferred embodiment of a hand-held laser pointer operable for providing a laser beam having a direction defining a longitudinal axis, the laser pointer comprises: (a) a housing; (b) a laser module enclosed within the housing; (c) a power supply enclosed within the housing and in electrical communication with the laser module; (d) a counterweight rigidly attached to a mirror by a bridge, the mirror, counterweight and bridge collectively forming an inertial mass having a center of gravity disposed on the bridge; (e) a gimbal affixed to said housing and said bridge at the center of gravity of said inertial mass, said gimbal pivoting on two intersecting and mutually perpendicular axes; and (f) means for biasing said gimbal-mounted inertial mass to a neutral position with respect to said housing, said biasing means being operable for damping angular vibration between said inertial mass and said housing while enabling said laser pointer to be panned.

The counterweight is preferably adjustable towards and away from said mutually perpendicular pivot axes of said gimbal. The means for biasing the inertial mass to a neutral position preferably employs a magnetic field interaction between a magnetic or ferromagnetic first material disposed on the inertial mass, and a ferromagnetic or magnetic second material affixed to said housing. An electrically conductive non-magnetic material may be disposed on the inertial mass in proximity to a second magnetic material affixed to the housing. The magnetic interaction therebetween provides a damping effect by the generation of eddy currents therein. Preferably, the magnetic material is movably mounted to the housing and adjustable towards and away from the conductive, non-magnetic material disposed on the inertial mass.

The mirrors are respectively mounted about pitch and yaw inertially stabilized frames disposed within the housing that provides for pivoting of the mirrors with respect to the housing about two axes that are orthogonal to the longitudinal axis (i.e., the beam axis) and to each other. The inertial stabilization is accomplished passively. The final mirror frame serves as an inertial mass that is balanced to be substantially free from gravitational influence while gimballed to the housing. The inertial mass is spring biased to a neutral position with respect to the housing. Damping elements may be positioned interior the housing and is provided to improve stabilization.

The aforesaid laser pointer provides a beam with low dot jitter. Low frequency angular movements of the housing such as occur during panning are transmitted to the laser beam while angular movements of the housing substantially at or above a predetermined frequency and, preferably, in a range similar to the frequencies associated with hand tremor, are isolated from the laser beam. The features of the invention believed to be novel are set forth with particularity in the appended claims. However the invention itself, both as to organization and method of operation, together with further objects and advantages thereof may be best understood by reference to the following description taken in conjunction with the accompanying drawings.

BRIEF DESCRIPTION OF THE DRAWINGS

FIG. 2 is a longitudinal bottom plan view of the laser pointer of FIG. 1.

FIG. 3 is a longitudinal side plan view of the laser pointer of FIGS. 1 and 2.

DESCRIPTION OF THE PREFERRED EMBODIMENTS

Figure 1:
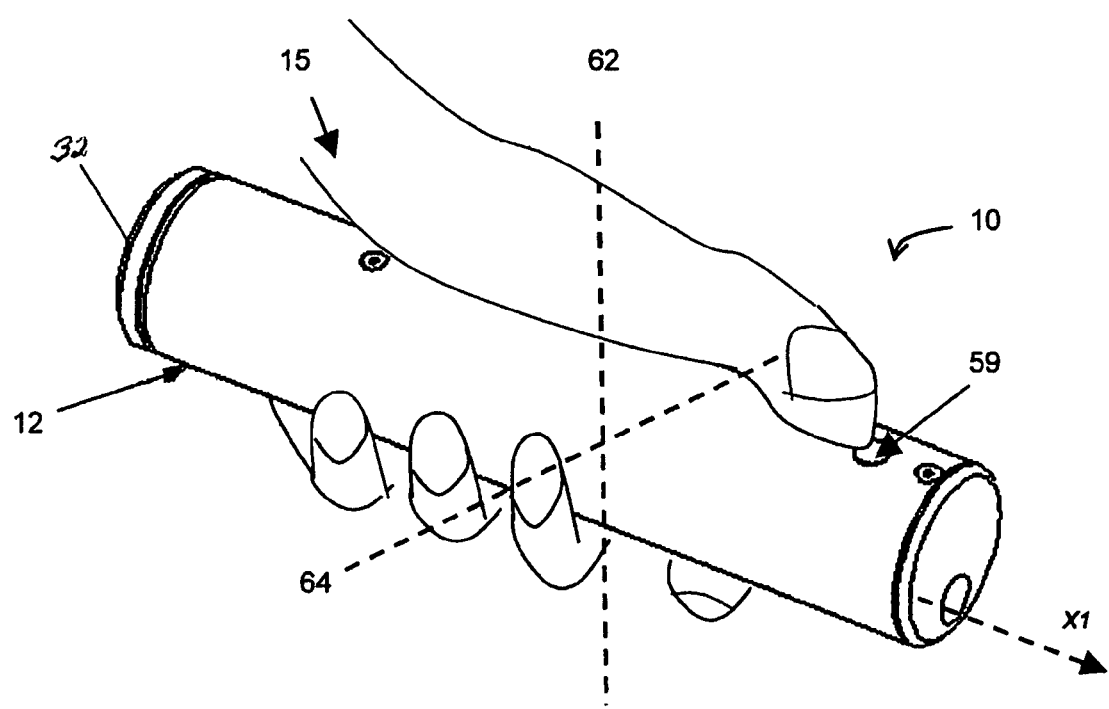
FIG. 1 is a perspective view of a tremor-stabilized, hand-held laser pointer in accordance with the present invention.
Figure 4:
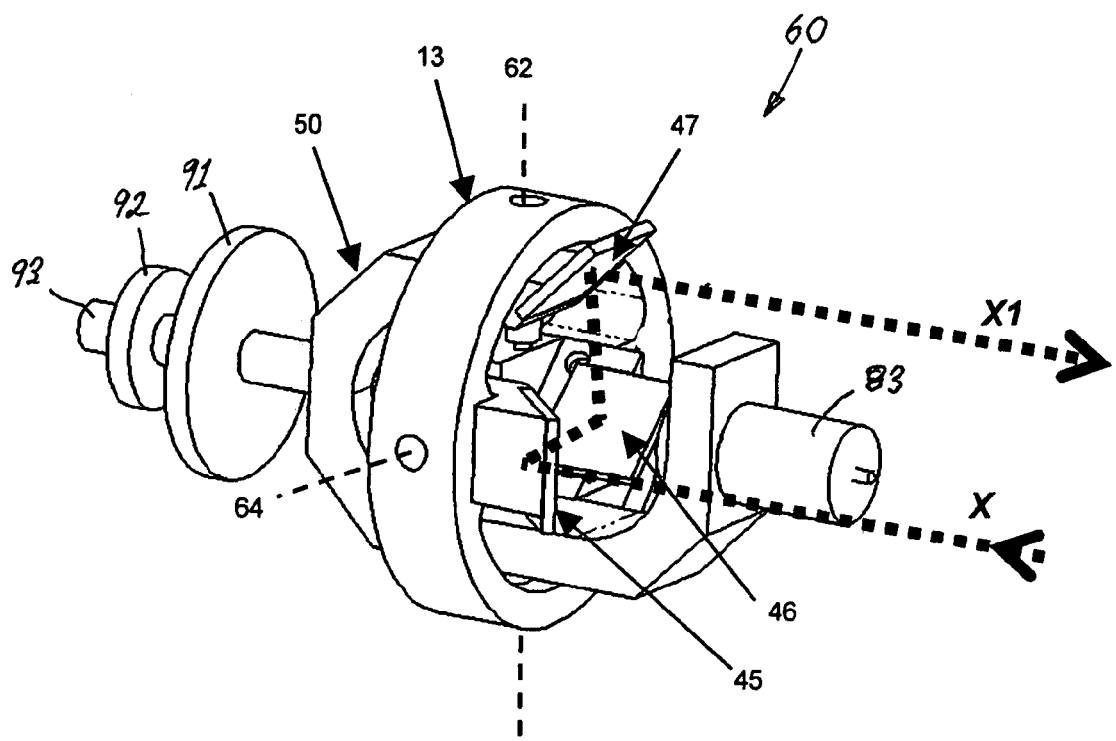
FIG. 4 is a schematic view of a gimbal included in a laser pointer according to the present invention.

Referring alternately to both FIGS. 1 and 2, the preferred embodiment of a hand-held laser pointer in accordance with the present invention is shown at 10. The laser pointer 10 generally includes a housing 12, a laser assembly 40 (FIG. 2), and a power source 16 (FIG. 2). The housing 12 has a inner surface 26. The housing 12 defines an open interior chamber 28. A transparent material 30 (FIG. 3) such as clear plastic, glass, or other optically transparent material separates the interior chamber 28 of the housing 12 from the external environment. The housing 12 includes a power supply access 32 for facilitating the mounting and dismounting of the power source 16. The power source 16 is preferably a single battery or a plurality of batteries.

The laser assembly 40 is well known in the art and includes a collimating lens, a laser element and a driving circuit. The laser element is preferably a laser diode that emits coherent light of a desired color such as red, green, blue, or infrared laser light. Suitable laser elements are produced by Nichia Corporation having a principle place of business at 491 Oka, Kaminaka-Cho, Anan-Shi, Tokushima 774-8601, Japan and by Cree, Inc., having a place of business at 4600 Silicon Drive, Durham, N.C. 27703.

The laser assembly 40 is rigidly attached to a structural element 14 affixed to the housing 12 and its output beam is aimed towards a mirror 45 affixed to gimbal element 13. Mirror 45 reflects the beam X towards a mirror 46. Mirror 46 reflects the beam towards mirror 47 to reflect a beam X1. The reflected beam X1 points in a direction substantially parallel with the first beam X exiting the front of the housing 12. The bridging element 50 is suspended in the housing 12 by a low friction gimbal 60 that pivots about substantially perpendicular first and second axes 62 and 64, each of which axes being perpendicular to longitudinal axis x1 (i.e., the beam axis). The gimbal 60 is pivotally mounted to the housing 12. Such pivotal mounting may be accomplished via pairs of pin and cup mechanisms 74 or other low friction bearing elements. The laser module assembly 40 and the bridging element 50 act as a pivoting inertial mass suspended by the gimbal 60. The housing for the laser module 40 and the bridging element 50 may be formed from either synthetic resinous materials or metallic materials.

In a preferred embodiment of the stabilized laser pointer 10, a threaded shaft 81 mounted to the housing 12 contains a magnet 80 and a ferromagnetic pin 82. The magnetic field from magnet 80 is focused though the ferromagnetic pin 82. A ferromagnetic pin 84 is mounted within a conductive non-magnetic material 83 mounted to the bridging element 50. The magnetic field of magnet 80 is focused through pin 82 to interact with the ferromagnetic material 84 to provide a small magnetic spring coupling between the pivoting inertial mass and the housing 12. The assembly comprising threaded element 81, pin 82, and magnet 80 can be adjusted towards or away from pin 84 to increase or decrease the magnetic restoring force.

A conductive non-magnetic material 92 is mounted on a non-magnetic shaft 93 connected to the bridging element 50. A ferromagnetic tube 94 and ferromagnetic washers 95 contain the magnetic field lines produced by ring magnet elements 90 and concentrate the magnetic field strength through the metallic non-magnetic discs 91 and 92 attached to shaft 93. Non-magnetic elements 93 axial restrain the magnets 90. A non-magnetic retainer flange 95 longitudinally restrains the magnets 90 within tube 94. The magnetic field produced by the magnets 90 is used to dampen the magnetic spring coupling between the pivoting inertial mass and the housing 12. For zero or small angular displacements of the inertial mass, only disc 91 is contained within the magnetic field. For large displacements, both discs 92 and 91 are within the magnetic field providing additional damping.

Essential tremor and postural tremor frequencies are generally between 4 Hz and 12 Hz. As such, the spring (magnetic coupling) and damping characteristics are sized for effective isolation of angular motion imparted to the gimbal assembly 60 (FIG. 3) about axes 62, 64 within this frequency range, while providing adequate angular motion coupling about axes 62, 64 for effective panning and tilting of the laser beam X1 during use. Various arrangements of these or other spring and damping materials may be employed to provide alternate or adjustable spring and damping characteristics.

Power is supplied to the laser assembly 40 by actuating the switch 58. Electrical connections between the power source 16, the switch 58, and the laser assembly 40 may be comprised of flexible wiring. A switch cover 59 protrudes through housing 12 and is direct contact with switche 58. Switch cover 59 can be pressed to activate switch 58.

When the user grasps the laser pointer 10 with his/her hand and switches on the switch 58, the laser beam is emitted from the laser assembly 40 through the transparent aperture 30 of the housing 12 towards a target. Low frequency angular movements of the housing are transmitted to the emitted laser beam X1 while angular movements of the housing 12 substantially at or above a predetermined frequency and, preferably, in a range similar to the frequencies associated with hand tremor, will be isolated from the laser beam X1. The preferred embodiment of the present invention passively accomplishes stabilization of the dot formed on a target from hand tremor that may be imparted to the laser pointer 10. A power source is not required for stabilization. It is relatively inexpensive to stabilize the laser assembly 14 in a passive fashion in accordance with the present invention than employing active stabilization.

While particular embodiments of the present invention have been illustrated and described, it would be obvious to those skilled in the art that various other changes and modifications can be made without departing from the spirit and scope of the invention. For example, this invention can be used to improve handheld laser range finding, laser targeting, surgical laser devices, handheld imaging devices, and handheld projectors. In addition, the laser pointer may be mounted on a transportable device, as, for example, on a vehicle, and still enjoy the advantages of the stabilization system. It is therefore intended to cover in the appended claims all such changes and modifications that are within the scope of this invention.

What we claim is:

1. A hand-held laser pointer operable for directing a laser beam to impinge upon a target comprising:
    (a) a housing adapted to be held by a hand, said housing having a housing axis;
    (b) a first mirror;
    (c) a second mirror pivotally attached to said first mirror, wherein said first mirror and said second mirror comprise a mirror assembly;
    (d) a laser supported by said housing, said laser being operable for producing a laser beam, wherein said laser beam is directed to impinge on said first mirror, said direction of said laser beam impinging on said first mirror defining a second axis that is perpendicular to said housing axis, said first mirror being pivotally mounted about an axis parallel to said second axis, wherein said first mirror reflects the laser beam to said second mirror, said reflected laser beam defining a third axis wherein said third axis is perpendicular to said housing axis and said second axis;
    (e) damping means operable for stabilizing said orientation of said first and second second mirror and corresponding reflected laser beam with respect to angular motion of the housing about said first and second axes when said motion is due to hand tremor.

2. The hand-held laser pointer of claim 1 wherein said damping means operable for stabilizing said orientation of said first and second second mirror and corresponding reflected laser beam with respect to angular motion of the housing about said first and second axes when said motion is due to hand tremor is magnetic coupling between said mirror assembly and said housing.

* * * * *

UNITED STATES PATENT AND TRADEMARK OFFICE
CERTIFICATE OF CORRECTION

PATENT NO. : 7,553,048 B2
APPLICATION NO. : 11/824312
DATED : June 30, 2009
INVENTOR(S) : Jeffrey Dale Wilson and Daniel Steven Sanchez It is certified that error appears in the above-identified patent and that said Letters Patent is hereby corrected as shown below:

Col. 4; Claim 1, Line 54, the text "second second" should be changed to --second--.

Col. 4; Claim 1, Line 56, the text "first and second" should be changed to --second and third--.

Col. 4; Claim 2, Line 60, the text "second second" should be changed to --second--.

Col. 4; Claim 2, Line 62, the text "first and second" should be changed to --second and third--.

Signed and Sealed this

Ninth Day of February, 2010

David J. Kappos
*Director of the United States Patent and Trademark Office*